United States Patent
Ebihara et al.

(10) Patent No.: US 11,381,771 B1
(45) Date of Patent: Jul. 5, 2022

(54) COMPARATOR FIRST STAGE CLAMP

(71) Applicant: OMNIVISION TECHNOLOGIES, INC., Santa Clara, CA (US)

(72) Inventors: Hiroaki Ebihara, San Jose, CA (US); Chengcheng Xu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 33 days.

(21) Appl. No.: 17/127,524

(22) Filed: Dec. 18, 2020

(51) Int. Cl.
*H04N 5/369* (2011.01)
*H04N 5/378* (2011.01)
*H03K 5/24* (2006.01)

(52) U.S. Cl.
CPC ............... *H04N 5/378* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 8,749,424 B2 | 6/2014 | Ueno | |
| 9,967,505 B1 | 5/2018 | Ebihara | |
| 10,079,990 B2 | 9/2018 | Ebihara et al. | |
| 10,498,322 B1 | 12/2019 | Ebihara | |
| 2019/0207596 A1* | 7/2019 | Sakakibara | ........ H03K 19/0185 |

* cited by examiner

*Primary Examiner* — Mark T Monk
(74) *Attorney, Agent, or Firm* — Perkins Coie LLP

(57) ABSTRACT

A comparator includes a first stage including a first output to generate a first output signal that transitions between an upper and lower voltage level in response to a comparison of first and second inputs of the first stage. A second stage includes an input coupled to receive the first output signal from the first output of the first stage, and a second output configured to generate a second output signal in response to the first output signal. A clamp circuit includes a first node and a second node. The first node is coupled to the first output of the first stage and the second node is coupled to a supply voltage. The clamp circuit is configured to clamp a voltage difference between the first node and the second node to clamp a voltage swing of the first output signal.

20 Claims, 9 Drawing Sheets

COMPARATOR FIRST STAGE CLAMP

BACKGROUND INFORMATION

Field of the Disclosure

This disclosure relates generally to image sensors, and in particular but not exclusively, relates to a comparator for use in analog to digital conversion in an image sensor.

Background

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
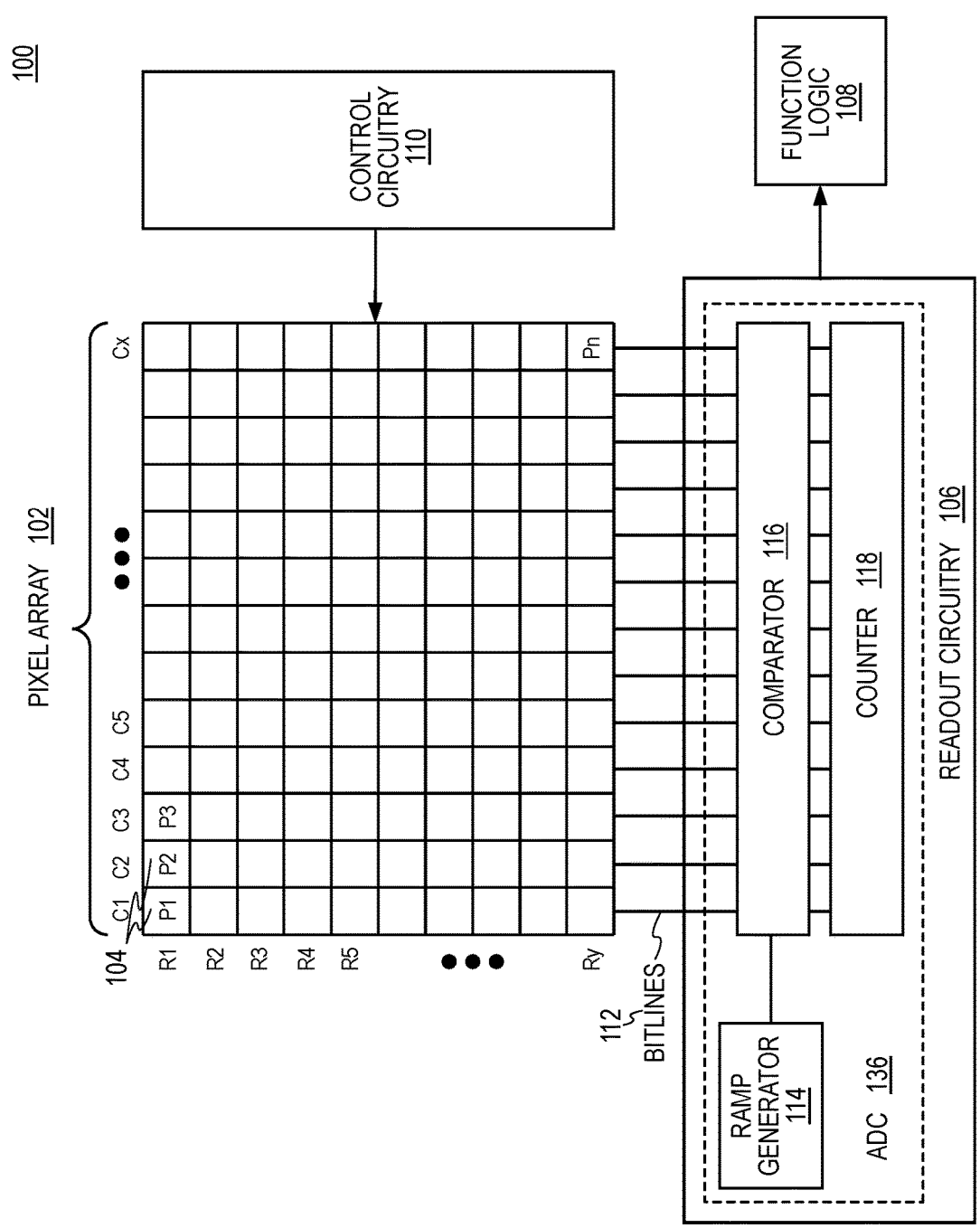
FIG. 1A illustrates one example of an imaging system with readout circuitry including one example of a comparator for use in an analog to digital converter in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples of an apparatus and system for a comparator with a clamp circuit configured to clamp a voltage swing of a first stage output of the comparator in an analog to digital converter of an image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A illustrates one example of an imaging system with readout circuitry 106 including one example of a comparator 116 for use with an analog to digital converter in accordance with the teachings of the present invention. As will be discussed, in various examples, comparator 116 is a multi-stage comparator with a clamp circuit that is configured to clamp a voltage difference between a first node and a second node of the clamp circuit to clamp a voltage swing of an output signal of a first stage of the comparator in accordance with an embodiment of the present disclosure.

As shown in FIG. 1A, imaging system 100 includes pixel array 102, control circuitry 110, readout circuitry 106, and function logic 108. In one example, pixel array 102 is a two-dimensional (2D) array of photodiodes or image sensor pixel cells 104 (e.g., pixel cells P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes/pixel cells do not necessarily have to be arranged into rows and columns and may take other configurations.

In one example, after each image sensor photodiode/pixel cell 104 in pixel array 102 has acquired its image data or image charge, the image data is read out by readout circuitry 106 and then transferred to function logic 108. Readout circuitry 106 may be coupled to read out image data from the plurality of photodiodes in the pixel cells 104 of the pixel array 102 through bitlines 112. As will be discussed in greater detail below, an analog to digital converter (ADC) 136 is included in the readout circuitry 106 to generate digital representations of the analog image data that is read out from the pixel array 102. In one example, the ADC 136 included in readout circuitry 106 is a single slope ADC, which includes a ramp generator 114, a comparator 116, and a counter 118. In the example, function logic 108 may be coupled to readout circuitry 106 to store the image data or even manipulate the image data by applying post image effects (e.g., crop, rotate, remove red eye, adjust brightness, adjust contrast, or otherwise). In one example, readout circuitry 106 may read out a row of image data at a time along the column bitlines 112 (illustrated) or may read out the image data using a variety of other techniques (not illustrated), such as a serial readout or a full parallel readout of all pixel cells simultaneously.

In the ADC 136 of the depicted example, a ramp signal may be received from the ramp generator 114 by the comparator 116, which may also receive image charge from a pixel cell 104 of the pixel array 102 through a respective column bitline 112. The ADC 136 may determine a digital representation of the image charge based on a comparison by the comparator 116 of the ramp signal from the ramp generator 114 to the image charge voltage level from the bitline 112. In the example, the counter 118 begins counting at the beginning of an analog to digital conversion process as a ramp event begins in the ramp signal from the ramp generator 114. The comparator 116 compares the ramp signal with the image charge voltage level, and the output of comparator 116 transitions or flips from a first state to a second state when the ramp signal matches the input image charge voltage level. In other words, this flipping point of the output of comparator 116 occurs when comparator 116 detects when the voltage level of the ramp signal from the ramp generator 114 is equal to the image charge voltage level from the bitline 112. As a result, the output of the comparator 116 flips from a first state (e.g., logic "1") to a second state (e.g., logic "0"), or vice versa, which is configured to stop the counter 118 from counting. The counter value from counter 118 can then be read out to determine the digital representation of the image charge voltage level from bitline 112.

In one example, control circuitry 110 is coupled to pixel array 102 to control operation of the plurality of pixel cells 104 in pixel array 102. For example, control circuitry 110 may generate a shutter signal for controlling image acquisition. In one example, the shutter signal is a global shutter signal for simultaneously enabling all pixel cells 104 within pixel array 102 to simultaneously capture their respective image data during a single acquisition window. In another example, the shutter signal is a rolling shutter signal such that each row, column, or group of pixel cells is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 1B:
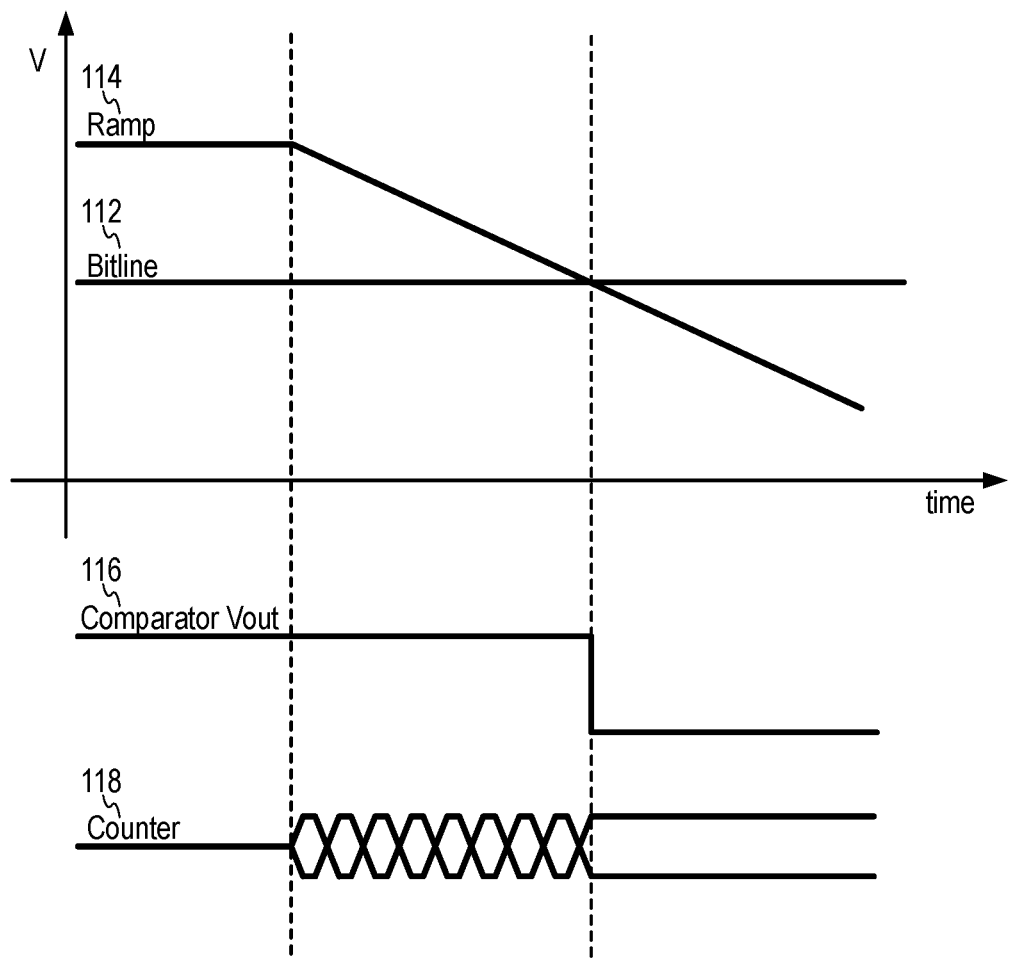
FIG. 1B is a timing diagram that illustrates some of the signals associated with a comparator as illustrated in FIG. 1A during an analog to digital conversion in an image sensor.

FIG. 1B is a timing diagram that illustrates some of the signals associated with ramp generator 114, comparator 116, and counter 118 of ADC 136 as illustrated in FIG. 1A during an analog to digital conversion in an image sensor. Specifically, FIG. 1B shows the ramp signal from ramp generator 114, the image charge voltage level from the bitline 112, the output voltage Vout from comparator 116, and the operation of counter 118 with respect to time during a single slope analog to digital conversion by ADC 136. As shown, the ramp event begins in ramp 114 as the ramp signal begins to ramp (e.g., ramp down) as the counter 118 begins counting at the first vertical dashed line in FIG. 1B. At this time, the comparator Vout 116 is in a first state (e.g., logic "high" or "1") while the voltage of ramp signal 114 is greater than the voltage of bitline 112.

Continuing with the example depicted in FIG. 1B, as soon as the ramp 114 is equal to or falls to a value less than the image charge voltage level indicated by the bitline 112, the comparator Vout 116 transitions or flips to a second state (e.g., logic "low" or "0") at the second vertical dashed line in FIG. 1B. At this time, the counter 118 stops counting. In the various examples, the value of counter 118 after it has been stopped is read out and used to determine the digital representation of the image charge voltage level from the bitline 112. In various examples, the ramp 114, bitline 112, comparator Vout 116, and counter 118 may then be reset before the next analog to digital conversion begins.

Figure 2A:
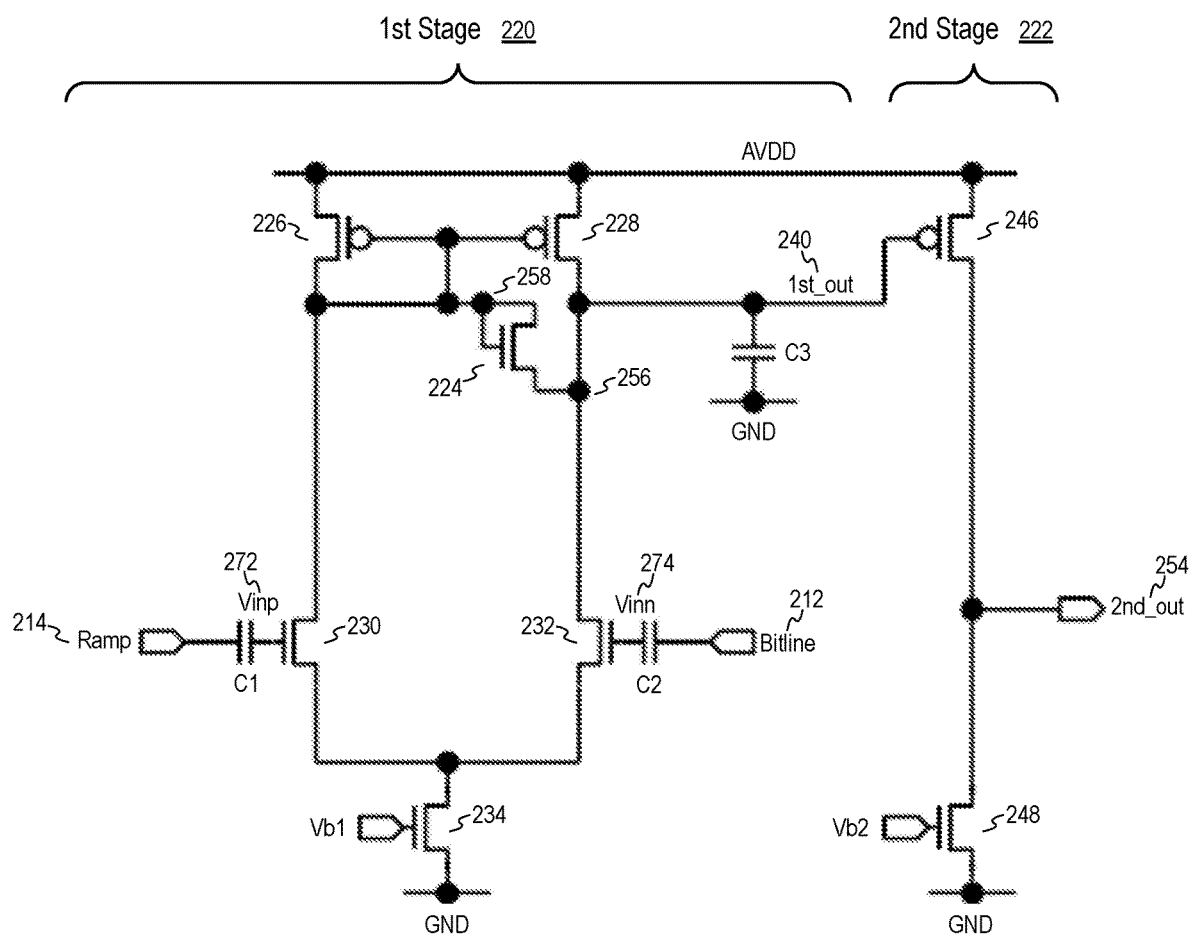
FIG. 2A illustrates a schematic that shows an example of a comparator with a clamp circuit configured to clamp a voltage swing of a first stage output of the comparator in an analog to digital converter of an image sensor.

FIG. 2A illustrates a schematic that shows an example of a comparator 216 with a clamp circuit configured to clamp a voltage swing of a first stage output of the comparator in an analog to digital converter of an image sensor. It is appreciated that the example comparator 216 illustrated of FIG. 2A may be an example implementation of comparator 116 as shown in FIG. 1A, and that similarly named and numbered elements described above are coupled and function similarly below.

As shown in the example depicted in FIG. 2A, the comparator 216 includes a first stage 220 coupled to a second stage 222. The first stage 220 includes transistor 226, transistor 228, transistor 230, transistor 232, and transistor 234. The sources of transistors 226 and 228 are coupled to a supply voltage. The gates of transistors 226 and 228 are coupled together and are coupled to the drain of transistor 226. The drain of transistor 230 is coupled to the drain of transistor 226, and the drain of transistor 232 is coupled to the drain of transistor 228. Transistor 234 is coupled between the sources of transistors 230 and 232 and a reference voltage, or ground. In the example, transistor 234 is a first stage current source with the gate of transistor 234 coupled to receive a bias voltage Vb1 and is biased to draw a constant current.

In the example, transistor 230 is a first input device of the first stage 220 with the gate of transistor 230 capacitively coupled to receive ramp 214 through capacitor C1. Transistor 232 is a second input device of the first state 220 with the gate of transistor 232 capacitively coupled to receive bitline 212 through capacitor C2. In the example depicted in FIG. 2A, the voltage at the gate of transistor 230 is labeled Vinp 272, and the voltage at the gate of transistor 232 is labeled Vinn 274. The drain of transistor 228 is configured to generate 1st_out 240, which is the output of the first stage 220. In the depicted example, a capacitor C3 is coupled between 1st_out 240 and the reference voltage or ground.

The second stage 222 includes a transistor 246 and a transistor 248 coupled between the supply voltage and the reference voltage or ground. Transistor 246 is an input device of the second stage 222 with the gate of transistor 246 coupled to receive 1st_out 240. In the example, transistor 248 is a second stage current source with the gate of transistor 248 coupled to receive a bias voltage Vb2. The drain of transistor 246 is configured to generate 2nd_out 254, which is the output of the second stage 222. In the example, it is appreciated that the output of comparator 216 is generated in response to 2nd_out 254.

The example depicted in FIG. 2A also illustrates a clamp circuit 224 having a first node 256 and a second node 258. In the example, the clamp circuit 224 is implemented with an n channel diode-connected transistor having a source coupled to the first node 256 and a gate and drain coupled to the second node 258. The first node 256 of the clamp circuit 224 is coupled to 1st_out 240 and the second node 258 is coupled to the gates of transistors 226 and 228. In operation, clamp circuit 224 is configured to clamp a voltage difference between the first node 256 and the second node 258 to clamp a voltage swing of the output signal at 1st_out 240.

In particular, the clamp circuit 224 is configured to prevent the output signal voltage at 1st_out 240 from settling too low. Without the clamp circuit 224, the 1st_out 224 voltage can drop until the first stage current source 234 falls into the linear region and the bias current of current source 234 is reduced, which affects the power rail. It is appreciated that by limiting the voltage swing of the output voltage signal at 1st_out 240 improves h-banding, which is affected by a change in the power rail. When the output signal voltage at 1st_out 240 changes, the capacitance on 1st_out 240 needs to be charged, and the charging current can cause h-banding. As a result, it is therefore important to limit the voltage swing 1st_out 240.

It is noted that one of the challenges presented with comparator 216 of FIG. 2A is that the clamp voltage on the output voltage signal at 1st_out 240 that is provided by the clamp circuit 224 settles to a level that is less than ideal. In particular, the clamp voltage provided by clamp circuit 224 of FIG. 2A is the Vgs voltage (e.g., ~0.8V) of the p channel transistors of the current mirror provided with transistors 226 and 228, combined with the Vgs voltage (e.g., ~0.9V) of the n channel diode-connected transistor of clamp circuit 224. Ideally, the output signal voltage at 1st_out 240 would be clamped immediately after the second stage 222 flips so that the clamped voltage, or the lower end of the voltage swing, is close to the Vgs voltage of the p channel transistor 246.

Figure 2B:
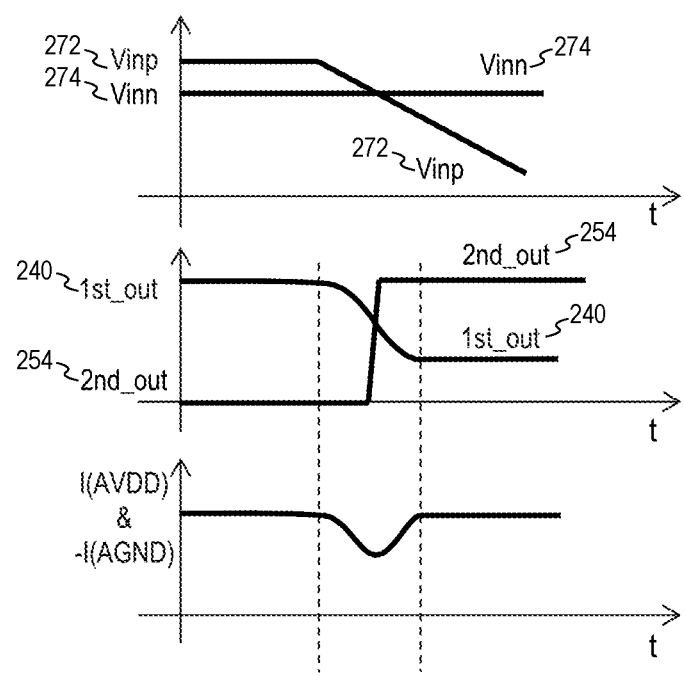
FIG. 2B is a timing diagram that illustrates some of the signals associated with a comparator as illustrated in FIG. 2A during an analog to digital conversion in an image sensor.

FIG. 2B is a timing diagram that illustrates some of the signals associated with a comparator 216 as illustrated in FIG. 2A during an analog to digital conversion in an image sensor. As shown, the comparator is used in a single slope ADC and the comparator is configured to compare the bitline voltage 212 with a ramp 214. In the example, the Vinp 272 voltage follows the ramp 214 and the Vinn 274 voltage follows the bitline voltage 212. FIG. 2B also shows an example of the 1st_out 240 voltage, the 2nd_out 254 voltage, and the I(AVDD) and −I(AGND) current through respective transistors 246 and 248 of the second stage with respect to time during a single slope analog to digital conversion.

As shown in the depicted example, prior to the first vertical dashed line, the Vinp 272 voltage is initially greater than the Vinn 274 voltage, the 1st_out 240 voltage is a positive voltage, the 2nd_out 254 voltage is substantially zero, and the I(AVDD) and −I(AGND) current is constant.

After the first vertical dashed line, the analog to digital conversion begins and a ramp event begins in the ramp signal 214, which is illustrated in FIG. 2B with Vinp 272 beginning to ramp down towards the Vinn 274 voltage. As the Vinp 272 voltage approaches or gets close to the Vinn 274 voltage, the output voltage signal at 1st_out 240 begins to transition or swing from the initial higher value (e.g., first state) to a lower value (e.g., second state). At the same time, the 2nd_out 254 value transitions from the lower substantially zero value to a higher value. During the transition, the I(AVDD) and −I(AGND) current dips and then settles back to the constant current value after the second vertical dashed line. As discussed previously, the voltage swing of 1st_out 240 is clamped by the clamp circuit 224 to a clamp voltage that is approximately equal to the Vgs voltage (e.g., ~0.8V) of the p channel transistors of the current mirror provided with transistors 226 and 228, combined with the Vgs voltage (e.g., ~0.9V) of the n channel diode-connected transistor of clamp circuit 224

Figure 3A:
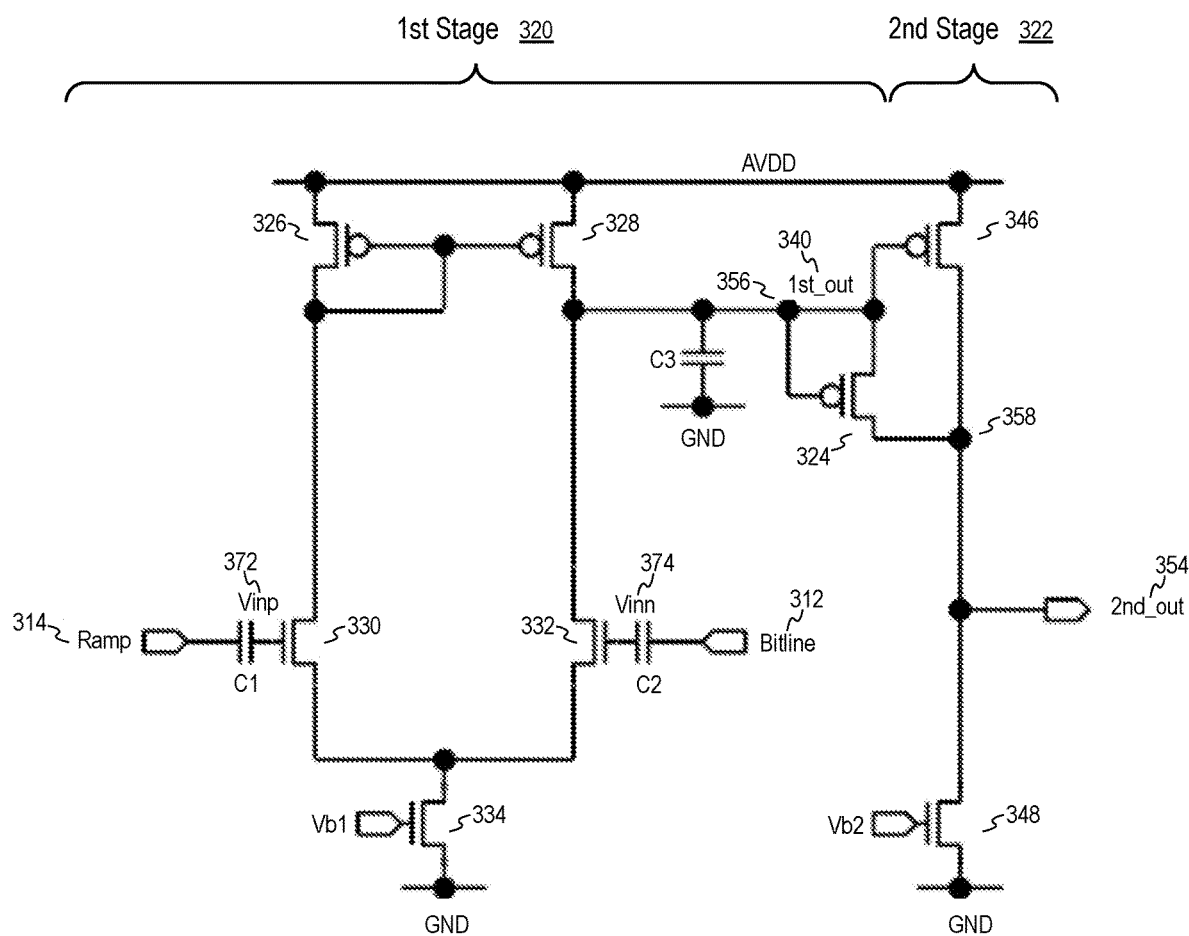
FIG. 3A illustrates a schematic that shows an example of a comparator with a clamp circuit configured to clamp a voltage swing of a first stage output of the comparator in an analog to digital converter of an image sensor in accordance with the teachings of the present invention.

FIG. 3A illustrates a schematic that shows an example of a comparator 316 with a clamp circuit configured to clamp a voltage swing of a first stage output of the comparator in an analog to digital converter of an image sensor in accordance with the teachings of the present invention. It is appreciated that the example comparator 316 illustrated of FIG. 3A may be an example implementation of comparator 116 as shown in FIG. 1A, and that similarly named and numbered elements described above are coupled and function similarly below.

As shown in the example depicted in FIG. 3A, the comparator 316 includes a first stage 320 coupled to a second stage 322. The first stage 320 includes transistor 326, transistor 328, transistor 330, transistor 332, and transistor 334. The sources of transistors 326 and 328 are coupled to a supply voltage (e.g., AVDD). The gates of transistors 326 and 328 are coupled together and are coupled to the drain of transistor 326. The drain of transistor 330 is coupled to the drain of transistor 326, and the drain of transistor 332 is coupled to the drain of transistor 328. Transistor 334 is coupled between the sources of transistors 330 and 332 and a reference voltage, or ground. In the example, transistor 334 is a first stage current source with the gate of transistor 334 coupled to receive a bias voltage Vb1 and is biased to draw a constant current.

In the example, transistor 330 is a first input device of the first stage 320 with the gate of transistor 330 capacitively coupled to receive ramp 314 through capacitor C1. Transistor 332 is a second input device of first state 320 with the gate of transistor 332 capacitively coupled to receive bitline 312 through capacitor C2. In the example depicted in FIG. 3A, the voltage at the gate of transistor 330 is labeled Vinp 372, and the voltage at the gate of transistor 332 is labeled Vinn 374. The drain of transistor 328 is configured to generate 1st_out 340, which is the output of the first stage 320. In the depicted example, a capacitor C3 is coupled between 1st_out 340 and the reference voltage or ground.

The second stage 322 includes a transistor 346 and a transistor 348 coupled between the supply voltage and the reference voltage or ground. Transistor 346 is an input device of the second stage 322 with the gate of transistor 346 coupled to receive 1st_out 340. In the example, transistor 348 is a second stage current source with the gate of transistor 348 coupled to receive a bias voltage Vb2. The drain of transistor 346 is configured to generate 2nd_out 354, which is the output of the second stage 322. In the example, it is appreciated that the output of comparator 316 is generated in response to 2nd_out 354.

The example depicted in FIG. 3A also illustrates a clamp circuit 324 having a first node 356 and a second node 358. In the example, the clamp circuit 324 is implemented with a p channel diode-connected transistor having a gate and drain coupled to the first node 356 and a source coupled to the second node 358. The first node 356 of the clamp circuit 324 is coupled to 1st_out 340 and the second node 358 is coupled to 2nd_out 354, which is coupled to the supply voltage AVDD through transistor 346 when transistor 346 is turned on. In operation, transistor 346 is turned on when the second stage 322 flips, which transitions the 2nd_out 354 voltage from substantially zero (e.g., first state) to substantially (or close to) AVDD (e.g., second state).

In operation, clamp circuit 324 is configured to clamp a voltage difference between the first node 356 and the second node 358 to clamp a voltage swing of the output signal at 1st_out 340. In this way, the voltage swing of 1st_out 340 is minimized in accordance with the teachings of the present invention.

It appreciated that in the example depicted in FIG. 3A, as the first stage 320 and the second stage 322 flip, and as the p channel diode-connected transistor of clamp circuit 324 turns on, clamp circuit 324 immediately clamps the 1st_out 340 after transistor 346 turns on and 2nd_out 354 transitions from low to high and the clip voltage can be close to the threshold voltage of the second stage 322 (e.g., the input where the second stage 322 flips) because the p channel diode-connected transistor clamp device is also PMOS transistor like transistor 346, and therefore has almost the same threshold voltage Vth as the second stage 322 input device transistor 346.

In addition, it is further appreciated that the p channel diode-connected transistor clamp device of clamp circuit 324 is ensured to be off before the first stage 320 and the second stage 322 flip because the 1st_out 340 is at a higher voltage level than the 2nd_out 354 prior to the comparison. As such, the clamp circuit 324 will not start to leak current prior to the first stage 320 and the second stage 322 flipping during a comparison operation.

In one example, it is noted that since the p channel diode-connected transistor clamp device of clamp circuit 324 is PMOS transistor, its body is therefore connected to AVDD instead of being connected to ground as would typically be the case for an NMOS transistor example, such as the example that is illustrated in FIG. 2A. As such, the p channel diode-connected transistor clamp device of clamp circuit 324 example of FIG. 3A is good for reducing h-banding and power supply rejection ratio (PSRR). In particular, the capacitance (e.g., the NMOS and parasitic capacitance) between 1st_out 240 and ground as shown in FIG. 2A is not preferred because it increases the charging current when 1st_out 240 transitions from high to low. For instance, in the example of an NMOS clamp device, the capacitance to ground is increased because the body of an NMOS transistor is usually connected to ground.

Figure 3B:
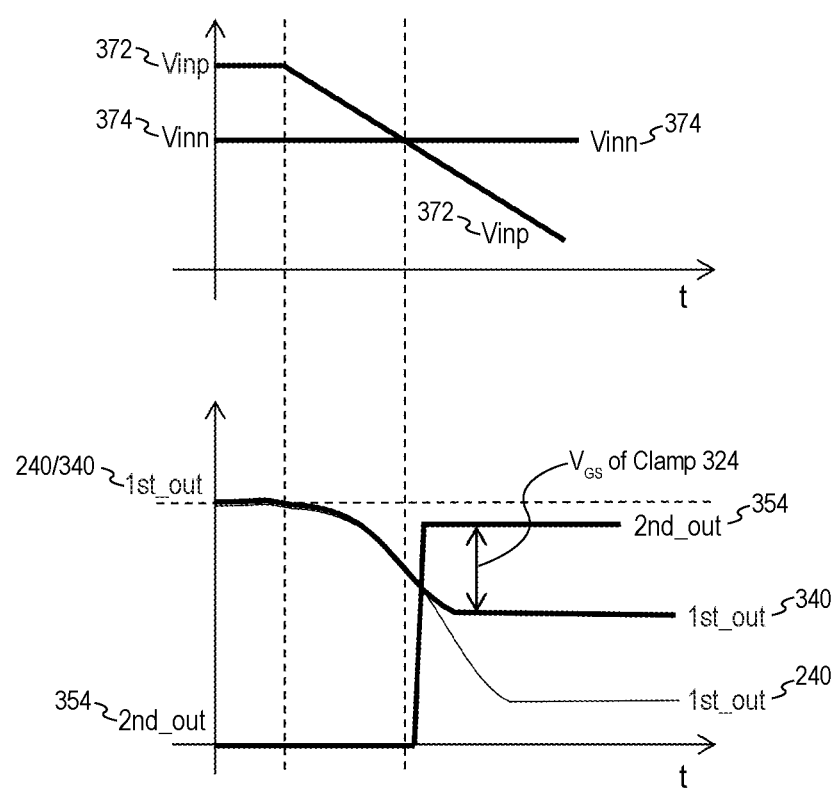
FIG. 3B is a timing diagram that illustrates some of the signals associated with a comparator as illustrated in FIG. 3A during an analog to digital conversion in an image sensor in accordance with the teachings of the present invention.

FIG. 3B is a timing diagram that illustrates some of the signals associated with a comparator 316 as illustrated in FIG. 3A during an analog to digital conversion in an image sensor. In the example, the comparator is used in a single slope ADC and the comparator is configured to compare the bitline voltage 312 with a ramp 314. In the example, the Vinp 372 voltage follows the ramp 314 and the Vinn 374 voltage follows the bitline voltage 312. FIG. 3B also shows an example of the 1st_out 240 voltage of the comparator 216 of FIG. 2A as well as the 1st_out 340 voltage and the 2nd_out 354 voltage of the comparator 316 of FIG. 3A with respect to time during a single slope analog to digital conversion.

As shown in the depicted example, prior to the first vertical dashed line, the Vinp 372 voltage is initially greater than the Vinn 374 voltage, the 1st_out 340 voltage is a positive voltage, and the 2nd_out 354 voltage is substantially zero.

After the first vertical dashed line, the analog to digital conversion begins and a ramp event begins in the ramp signal 314, which is illustrated in FIG. 3B with Vinp 372 beginning to ramp down towards the Vinn 374 voltage. As the Vinp 372 voltage approaches or becomes close to the Vinn 374 voltage at the second vertical dashed line, the output voltage signal at 1st_out 240 and the output voltage signal at 1st_out 340 begin to transition or swing from the initial higher value (e.g., first state) to a lower value (e.g., second state). At the same time, the 2nd_out 354 value transitions from the lower substantially zero value to a higher value as the first stage 220/320 and second stage 222/322 flip. As shown in the example, the voltage swing of 1st_out 340 is clamped by the clamp circuit 324 to a clamp voltage that is approximately equal to the Vgs voltage of clamp circuit 324 below 2nd_out 354, which is less than the voltage swing of 1st_out 240 of FIG. 2A as the clamp voltage of the voltage swing of 1st_out 240 also includes the Vgs of the p channel transistors of the current mirror provided with transistors 226 and 228. Therefore, the clamp voltage provided by clamp circuit 324 of FIG. 3A reduces the voltage swing of 1st_out 340 compared to the voltage swing of 1st_out 240 of FIG. 2A in accordance with the teachings of the present invention.

Figure 4A:
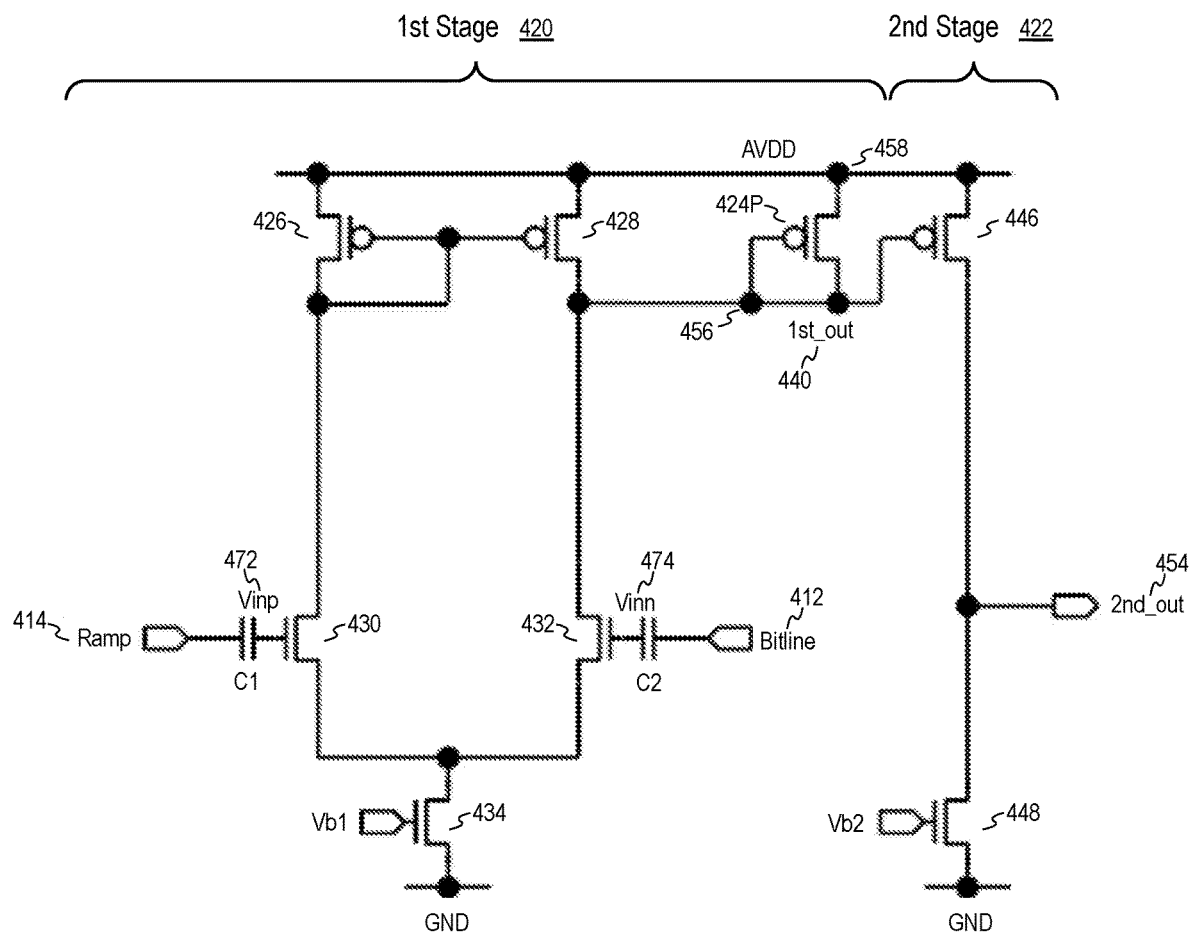
FIG. 4A illustrates a schematic that shows another example of a comparator with a clamp circuit configured to clamp a voltage swing of a first stage output of the comparator in an analog to digital converter of an image sensor in accordance with the teachings of the present invention.

FIG. 4A illustrates a schematic that shows another example of a comparator 416A with a clamp circuit configured to clamp a voltage swing of a first stage output of the comparator in an analog to digital converter of an image sensor in accordance with the teachings of the present invention. It is appreciated that the example comparator 416A illustrated of FIG. 4A may be another example implementation of comparator 116 as shown in FIG. 1A, and that similarly named and numbered elements described above are coupled and function similarly below. It is also appreciated that the example comparator 416A illustrated of FIG. 4A shares similarities with the example comparator 316 illustrated of FIG. 3A.

For instance, as shown in the example depicted in FIG. 4A, the comparator 416A includes a first stage 420 coupled to a second stage 422. The first stage 420 includes transistor 426, transistor 428, transistor 430, transistor 432, and transistor 434. The sources of transistors 426 and 428 are coupled to a supply voltage. The gates of transistors 426 and 428 are coupled together and are coupled to the drain of transistor 426. The drain of transistor 430 is coupled to the drain of transistor 426, and the drain of transistor 432 is coupled to the drain of transistor 428. Transistor 434 is coupled between the sources of transistors 430 and 432 and a reference voltage, or ground. In the example, transistor 434 is a first stage current source with the gate of transistor 434 coupled to receive a bias voltage Vb1 and is biased to draw a constant current.

In the example, transistor 430 is a first input device of first stage 420 with the gate of transistor 430 capacitively coupled to receive ramp 414 through capacitor C1. Transistor 432 is a second input device of first stage 420 with the gate of transistor 432 capacitively coupled to receive bitline 412 through capacitor C2. In the example depicted in FIG. 4A, the voltage at the gate of transistor 430 is labeled Vinp 472, and the voltage at the gate of transistor 432 is labeled Vinn 474. The drain of transistor 428 is configured to generate 1st_out 440, which is the output of the first stage 420.

The second stage 422 includes a transistor 446 and a transistor 448 coupled between the supply voltage and the reference voltage or ground. Transistor 446 is an input device of the second stage 422 with the gate of transistor 446 coupled to receive 1st_out 440. In the example, transistor 448 is a second stage current source with the gate of transistor 448 coupled to receive a bias voltage Vb2. The drain of transistor 446 is configured to generate 2nd_out 454, which is the output of the second stage 422. In the example, it is appreciated that the output of comparator 416A is generated in response to 2nd_out 454.

The example depicted in FIG. 4A also illustrates a clamp circuit 424P having a first node 456 and a second node 458. In the example, the clamp circuit 424P is implemented with a p channel diode-connected transistor having a gate and drain coupled to the first node 456 and a source coupled to the second node 458. The first node 456 of the clamp circuit 424P is coupled to 1st_out 440 and the second node 458 is coupled to the supply voltage AVDD. In operation, transistor 446 is turned on when the second stage 422 flips, which transitions the 2nd_out 454 voltage from substantially zero (e.g., first state) to substantially or close to AVDD (e.g., second state).

In operation, clamp circuit 424P is configured to clamp a voltage difference between the first node 456 and the second node 458 to clamp a voltage swing of the output signal at 1st_out 440. In this way, the voltage swing of 1st_out 440 is minimized in accordance with the teachings of the present invention.

As can be appreciated in the example depicted in FIG. 4A, the p channel diode-connected transistor of clamp circuit 424P is configured as a passive device with the threshold voltage Vth of p channel diode-connected transistor of clamp circuit 424P nearly the same as the 2nd stage input device p channel transistor 446. As such, it is noted that the p channel diode-connected transistor of clamp circuit 424P may start to leak current before the 2nd_out 454 flips, which may affect the performance of the comparator 416A.

Figure 4B:
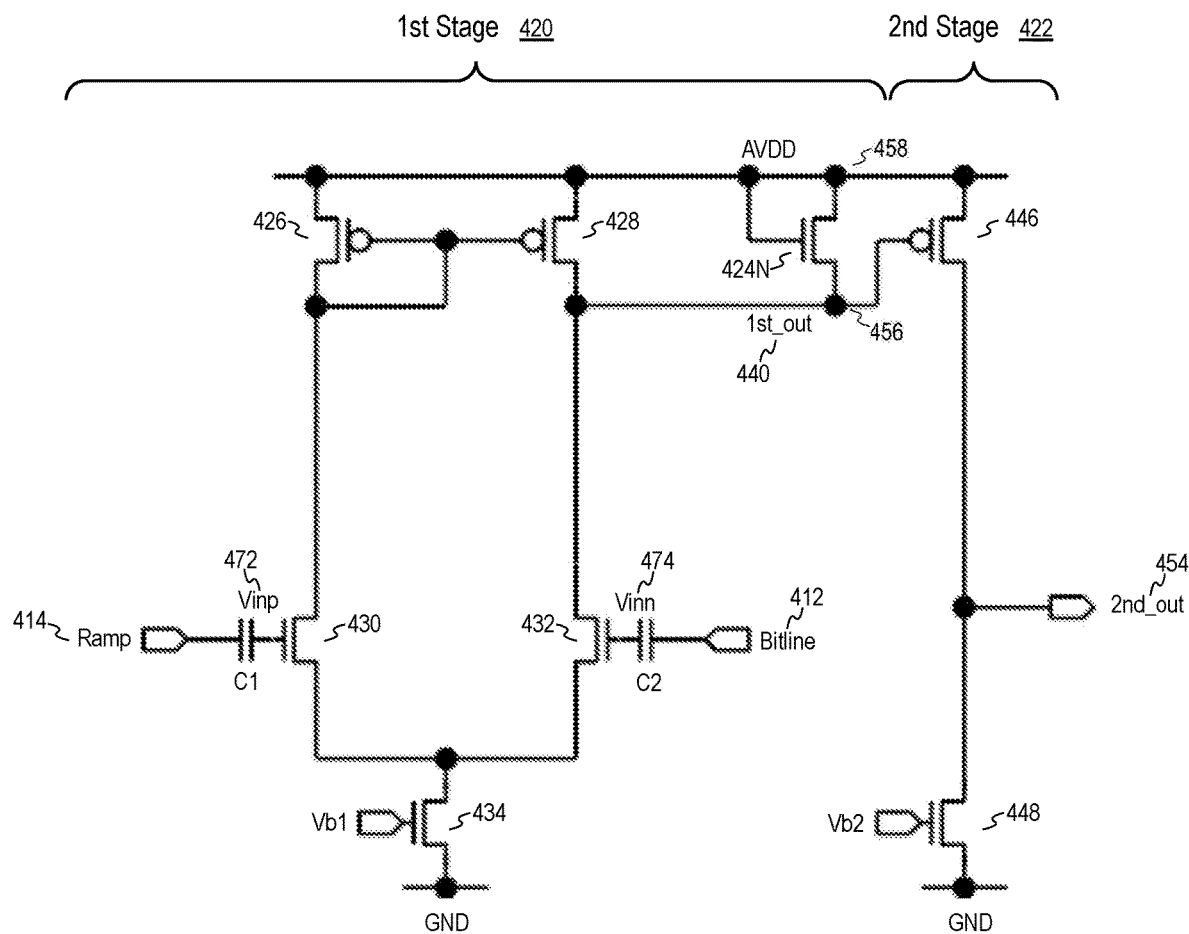
FIG. 4B illustrates a schematic that shows yet another example of a comparator with a clamp circuit configured to clamp a voltage swing of a first stage output of the comparator in an analog to digital converter of an image sensor in accordance with the teachings of the present invention.

FIG. 4B illustrates a schematic that shows yet another example of a comparator 416B with a clamp circuit configured to clamp a voltage swing of a first stage output of the comparator in an analog to digital converter of an image sensor in accordance with the teachings of the present invention. It is appreciated that the example comparator 416B illustrated of FIG. 4B may be another example implementation of comparator 116 as shown in FIG. 1A, and that similarly named and numbered elements described above are coupled and function similarly below. It is appreciated that the example comparator 416B illustrated of FIG. 4B shares similarities with the example comparator 416A illustrated of FIG. 4A.

For instance, as shown in the example depicted in FIG. 4B, the comparator 416B includes a first stage 420 coupled to a second stage 422. The first stage 420 includes transistor 426, transistor 428, transistor 430, transistor 432, and transistor 434. The sources of transistors 426 and 428 are coupled to a supply voltage. The gates of transistors 426 and 428 are coupled together and are coupled to the drain of transistor 426. The drain of transistor 430 is coupled to the drain of transistor 426, and the drain of transistor 432 is coupled to the drain of transistor 428. Transistor 434 is coupled between the sources of transistors 430 and 432 and a reference voltage, or ground. In the example, transistor 434 is a first stage current source with the gate of transistor 434 coupled to receive a bias voltage Vb1 and is biased to draw a constant current.

In the example, transistor 430 is a first input device of first stage 420 with the gate of transistor 430 capacitively coupled to receive ramp 414 through capacitor C1. Transistor 432 is a second input device of the first stage 420 with the gate of transistor 432 capacitively coupled to receive bitline 412 through capacitor C2. In the example depicted in FIG. 4B, the voltage at the gate of transistor 430 is labeled Vinp 472, and the voltage at the gate of transistor 432 is labeled Vinn 474. The drain of transistor 428 is configured to generate 1st_out 440, which is the output of the first stage 420.

The second stage 422 includes a transistor 446 and a transistor 448 coupled between the supply voltage and the reference voltage or ground. Transistor 446 is an input device of the second stage 422 with the gate of transistor 446 coupled to receive 1st_out 440. In the example, transistor 448 is a second stage current source with the gate of transistor 448 coupled to receive a bias voltage Vb2. The drain of transistor 446 is configured to generate 2nd_out 454, which is the output of the second stage 422. In the example, it is appreciated that the output of comparator 416A is generated in response to 2nd_out 454.

The example depicted in FIG. 4B also illustrates a clamp circuit 424N having a first node 456 and a second node 458.

In the example, the clamp circuit 424N is implemented with an n channel diode-connected transistor having a source coupled to the first node 456 and a gate and a drain coupled to the second node 458. The first node 456 of the clamp circuit 424N is coupled to 1st_out 440 and the second node 458 is coupled to the supply voltage AVDD. In operation, transistor 446 is turned on when the second stage 422 flips, which transitions the 2nd_out 454 voltage from substantially zero (e.g., first state) to substantially or close to AVDD (e.g. second state).

In operation, clamp circuit 424N is configured to clamp a voltage difference between the first node 456 and the second node 458 to clamp a voltage swing of the output signal at 1st_out 440. In this way, the voltage swing of 1st_out 440 is minimized in accordance with the teachings of the present invention.

As can be appreciated in the example depicted in FIG. 4B, the n channel diode-connected transistor of clamp circuit 424N is configured as a passive device with the threshold voltage Vth of n channel diode-connected transistor of clamp circuit 424N higher than that of the 2nd stage input device p channel transistor 446. However, it is noted that the performance of an n channel diode-connected transistor of clamp circuit 424N may vary as a result of process variations. Thus, in situations where the threshold voltage Vth of the n channel diode-connected transistor of clamp circuit 424N is lower, and the threshold voltage Vth of p channel transistor 446 is higher, the n channel diode-connected transistor of clamp circuit 424N may start to leak before the comparator 416B makes a comparison decision.

Figure 5:
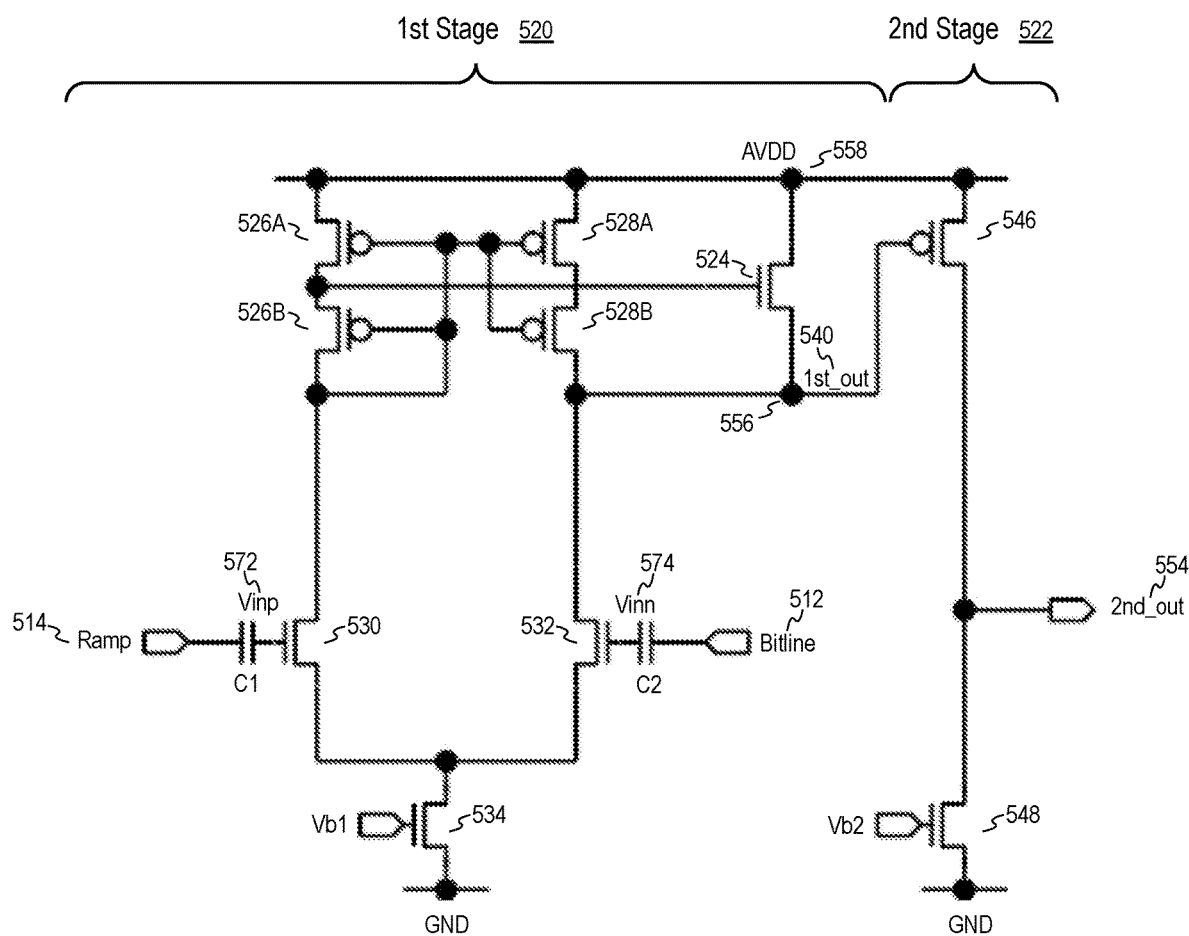
FIG. 5 illustrates a schematic that shows still another example of a comparator with a clamp circuit configured to clamp a voltage swing of a first stage output of the comparator in an analog to digital converter of an image sensor in accordance with the teachings of the present invention.

FIG. 5 illustrates a schematic that shows still another example of a comparator 516 with a clamp circuit configured to clamp a voltage swing of a first stage output of the comparator in an analog to digital converter of an image sensor in accordance with the teachings of the present invention. It is appreciated that the example comparator 516 illustrated of FIG. 5 may be another example implementation of comparator 116 as shown in FIG. 1A, and that similarly named and numbered elements described above are coupled and function similarly below. It is also appreciated that the example comparator 516 illustrated of FIG. 5 shares similarities with the example comparator 416B illustrated of FIG. 4B.

For instance, as shown in the example depicted in FIG. 5, the comparator 516 includes a first stage 520 coupled to a second stage 522. The first stage 520 includes a first split transistor, which includes a transistor 526A coupled in series with a transistor 526B, a second split transistor, which includes a transistor 528A coupled in series with a transistor 528B, a transistor 530, a transistor 532, and a transistor 534. As shown in the depicted example, the gate of transistor 526A is coupled to the gate and drain of fourth transistor 526B, the source of transistor 526A is coupled to a supply voltage, the drain of transistor 526A is coupled to the source of transistor 526B, and the drain of transistor 526B is coupled to the source of transistor 530. Similarly, the gate of transistor 528A is coupled to the gate of transistor 528B and the gates of transistors 526A and 526B, The source of transistor 528A is coupled to the supply voltage, the drain of transistor 528A is coupled to the source of transistor 528B, and the drain of transistor 528B is coupled to 1st_out 540 output of the first stage 520 and the source of transistor 532. Transistor 534 is coupled between the sources of transistors 530 and 532 and a reference voltage, or ground. In the example, transistor 534 is a first stage current source with the gate of transistor 534 coupled to receive a bias voltage Vb1 and is biased to draw a constant current.

In the example, transistor 530 is a first input device of the first stage 520, with the gate of transistor 530 capacitively coupled to receive ramp 514 through capacitor C1. Transistor 532 is a second input device of the first stage 520, with the gate of transistor 532 capacitively coupled to receive bitline 512 through capacitor C2. In the example depicted in FIG. 5, the voltage at the gate of transistor 530 is labeled Vinp 572, and the voltage at the gate of transistor 532 is labeled Vinn 574. The drain of transistor 528B is configured to generate 1st_out 540, which is the output of the first stage 520.

The second stage 522 includes a transistor 546 and a transistor 548 coupled between the supply voltage and the reference voltage or ground. Transistor 546 is an input device of the second stage 522 with the gate of transistor 546 coupled to receive 1st_out 540. In the example, transistor 548 is a second stage current source with the gate of transistor 548 coupled to receive a bias voltage Vb2. The drain of transistor 546 is configured to generate 2nd_out 554, which is the output of the second stage 522. In the example, it is appreciated that the output of comparator 516 is generated in response to 2nd_out 554.

The example depicted in FIG. 5 also illustrates a clamp circuit 524 having a first node 556 and a second node 558. In the example, the clamp circuit 524 is implemented with an n channel transistor having a source coupled to the first node 456 and a drain coupled to the second node 558.

One difference between clamp circuit 524 of FIG. 5 and clamp circuit 424B of FIG. 4B is that in order to prevent the n channel transistor of clamp circuit 524 from leaking current before the comparator 516 makes the decision, the gate voltage of the n channel transistor of clamp circuit 524 is decreased compared to the gate voltage of the n channel diode-connected transistor of clamp circuit 424B of FIG. 4B. In particular, the example depicted in FIG. 5 illustrates that the reduced gate voltage for the n channel transistor of clamp circuit 524 is provided by the source/drain node between the p channel transistors 526A and 526B of the first split transistor.

Thus, before the comparator 516 makes the decision and before the second stage 522 flips, the p channel current mirror implemented with the first and second split transistors including transistors 526A/526B and 528A/528B draws current so that the gate voltage of the n channel transistor of clamp circuit 524 is lower than the supply voltage (e.g., AVDD) so that the n channel transistor of clamp circuit 524 is prevented from leaking current before the 2nd_out 554 transitions to a high value.

However, it is appreciated that if the threshold voltage Vth of the n channel transistor of clamp circuit 524 is large, the clamp voltage provided by clamp circuit 524 may be lower (e.g, compared to clamp circuit 324 of FIG. 3A) such that clamp circuit 524 is less efficient. Furthermore, the body of the n channel transistor of clamp circuit 524 is typically coupled to ground, which causes the capacitance between 1st_out 540 and the supply voltage (e.g., AVDD) to be larger.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A comparator, comprising:
a first stage including a first input coupled to receive a first signal, a second input coupled to receive a second signal, and a first output configured to generate a first output signal that transitions between an upper voltage level and a lower voltage level in response to a comparison of the first and second input signals;
a second stage having an input coupled to receive the first output signal from the first output of the first stage, wherein the second stage includes a second output configured to generate a second output signal in response to the first output signal; and
a clamp circuit having a first node and a second node, wherein the first node is coupled to the first output of the first stage and the second node is coupled to a supply voltage, wherein the clamp circuit is configured to clamp a voltage difference between the first node and the second node to clamp a voltage swing of the first output signal.

2. The comparator of claim 1, wherein the clamp circuit comprises a diode-connected transistor coupled between the first node and the second node.

3. The comparator of claim 2, wherein the diode-connected transistor of the clamp circuit comprises a p channel diode-connected transistor having a gate and a drain coupled to the first node, and a source coupled to the second node.

4. The comparator of claim 3, wherein the second stage comprises:
an input device having a source coupled to the supply voltage, wherein a gate of the input device of the second stage is coupled to the input of the second stage, a drain of the input device of the second stage is coupled to the second output; and
a second stage bias current source coupled to the drain of the input device of the second stage.

5. The comparator of claim 4, wherein the second node of the clamp circuit is coupled to the supply voltage through the input device of the second stage when the input device of the second stage is turned on.

6. The comparator of claim 2, wherein the diode-connected transistor of the clamp circuit is an n channel diode-connected transistor having a source coupled to the first node, and a gate and a drain coupled to the second node.

7. The comparator of claim 1, wherein the first stage comprises:
a first transistor having a source coupled to the supply voltage;
a second transistor having a source coupled to the supply voltage, and a gate coupled to a gate and a drain of the first transistor, wherein a drain of the second transistor is coupled to the first output of the first stage to generate the first output signal;
a first stage bias current source;
a first input device coupled between the drain of the first transistor and the first stage bias current source, wherein a gate of the first input device is coupled to the first input of the first stage to receive the first signal; and
a second input device coupled between the drain of the second transistor and the first stage bias current source, wherein a gate of the second input device is coupled to the second input of the first stage to receive the second signal.

8. The comparator of claim 7,
wherein the first transistor comprises a first split transistor comprising a third transistor coupled in series with a fourth transistor, wherein a gate of the third transistor is coupled to a gate of the fourth transistor, a source of the third transistor is coupled to the supply voltage, a drain of the third transistor is coupled to a source of the fourth transistor, and a drain of the fourth transistor is coupled to the first input device,
wherein the second transistor comprises a second split transistor comprising a fifth transistor coupled in series with a sixth transistor, wherein a gate of the fifth transistor is coupled to a gate of the sixth transistor, a source of the fifth transistor is coupled to the supply voltage, a drain of the fifth transistor is coupled to a source of the sixth transistor, and a drain of the sixth transistor is coupled to the first output of the first stage and the second input device.

9. The comparator of claim 8, wherein the clamp circuit comprises an n channel transistor having a source coupled to the first node, a drain coupled to the second node, and a gate coupled to the drain of the fifth transistor and the source of the sixth transistor.

10. The comparator of claim 1,
wherein the comparator is included in an analog to digital converter included in an imaging system,
wherein the first signal coupled to be received by the first input of the first stage is a ramp signal from a ramp generator,
wherein the second signal coupled to be received by the second input of the first stage is a bitline signal from a bitline coupled to an array of pixels.

11. An imaging system, comprising:
an array of pixels to receive image light and generate image charge voltage signals in response to the image light; and
readout circuitry coupled to receive the image charge voltage signals from the array of pixels through a plurality of bitlines, and provide a digital representation of a bitline signal from each of the plurality of bitlines in response, the readout circuitry including a comparator to receive the bitline signal, compare the bitline signal to a ramp signal from a ramp generator, and provide a comparator output voltage to a counter to generate the digital representation in response, wherein the comparator comprises:
a first stage including a first input coupled to receive the bitline signal, a second input coupled to receive the ramp signal, and a first output configured to generate a first output signal that transitions between an upper voltage level and a lower voltage level in response to a comparison of the first and second input signals;
a second stage having an input coupled to receive the first output signal from the first output of the first stage, wherein the second stage includes a second output configured to generate a second output signal in response to the first output signal, wherein the comparator output voltage provided to the counter is responsive to the second output signal; and
a clamp circuit having a first node and a second node, wherein the first node is coupled to the first output of the first stage and the second node is coupled to a supply voltage, wherein the clamp circuit is configured to clamp a voltage difference between the first node and the second node to clamp a voltage swing of the first output signal.

12. The imaging system of claim 11, wherein the clamp circuit comprises a diode-connected transistor coupled between the first output of the first stage and the supply voltage.

13. The imaging system of claim 12, wherein the diode-connected transistor of the clamp circuit comprises a p channel diode-connected transistor having a gate and a drain coupled to the first node, and a source coupled to the second node.

14. The imaging system of claim 13, wherein the second stage comprises:
   an input device having a source coupled to the supply voltage, wherein a gate of the input device of the second stage is coupled to the input of the second stage, a drain of the input device of the second stage is coupled to the second output; and
   a second stage bias current source coupled to the drain of the input device of the second stage.

15. The imaging system of claim 14, wherein the second node of the clamp circuit is coupled to the supply voltage through the input device of the second stage when the input device of the second stage is turned on.

16. The imaging system of claim 12, wherein the diode-connected transistor of the clamp circuit comprises an n channel diode-connected transistor having a source coupled to the first node, and a gate and a drain coupled to the second node.

17. The imaging system of claim 11, wherein the first stage comprises:
   a first transistor having a source coupled to the supply voltage;
   a second transistor having a source coupled to the supply voltage, and a gate coupled to a gate and a drain of the first transistor, wherein a drain of the second transistor is coupled to the first output of the first stage to generate the first output signal;
   a first stage bias current source;
   a first input device coupled between the drain of the first transistor and the first stage bias current source, wherein a gate of the first input device is coupled to the first input of the first stage to receive the ramp signal; and
   a second input device coupled between the drain of the second transistor and the first stage bias current source, wherein a gate of the second input device is coupled to the second input of the first stage to receive the bitline signal.

18. The imaging system of claim 17,
   wherein the first transistor comprises a first split transistor comprising a third transistor coupled in series with a fourth transistor, wherein a gate of the third transistor is coupled to a gate of the fourth transistor, a source of the third transistor is coupled to the supply voltage, a drain of the third transistor is coupled to a source of the fourth transistor, and a drain of the fourth transistor is coupled to the first input device,
   wherein the second transistor comprises a second split transistor comprising a fifth transistor coupled in series with a sixth transistor, wherein a gate of the fifth transistor is coupled to a gate of the sixth transistor, a source of the fifth transistor is coupled to the supply voltage, a drain of the fifth transistor is coupled to a source of the sixth transistor, and a drain of the sixth transistor is coupled to the first output of the first stage and the second input device.

19. The imaging system of claim 18, wherein the clamp circuit comprises an n channel transistor having a source coupled to the first node, a drain coupled to the second node, and a gate coupled to the drain of the fifth transistor and the source of the sixth transistor.

20. The imaging system of claim 11, wherein the comparator is included in an analog to digital converter included in the readout circuitry.

\* \* \* \* \*